US007243507B2

(12) United States Patent
Shapiro

(10) Patent No.: US 7,243,507 B2
(45) Date of Patent: Jul. 17, 2007

(54) CRYOGENIC COMPUTER SYSTEM WITH PARALLEL MULTIPLE COOLING TEMPERATURES

(76) Inventor: Leonid A. Shapiro, 1588 Longeaton Dr., Upper Arlington, OH (US) 43220

( * ) Notice: Subject to any disclaimer, the term of this patent is extended or adjusted under 35 U.S.C. 154(b) by 146 days.

(21) Appl. No.: 11/060,896

(22) Filed: Feb. 19, 2005

(65) Prior Publication Data

US 2006/0185379 A1    Aug. 24, 2006

(51) Int. Cl.
*F25D 23/12* (2006.01)

(52) U.S. Cl. .................... 62/259.2; 165/104.33

(58) Field of Classification Search ........... 62/50.2, 62/51.1, 295, 297, 298, 259.2; 165/104.33; 361/702, 725
See application file for complete search history.

(56) References Cited

U.S. PATENT DOCUMENTS

| | | | | |
|---|---|---|---|---|
| 3,260,055 A * | 7/1966 | Webb | ............................. | 62/6 |
| 3,306,075 A * | 2/1967 | Cowans | ..................... | 62/51.1 |
| 4,831,828 A * | 5/1989 | Klusmier et al. | ................ | 62/6 |
| 4,980,848 A * | 12/1990 | Griffin et al. | ............... | 361/687 |
| 6,136,274 A * | 10/2000 | Nova et al. | .................. | 422/102 |
| 6,195,372 B1 * | 2/2001 | Brown | ........................ | 372/34 |
| 6,532,152 B1 * | 3/2003 | White et al. | ................. | 361/692 |
| 6,532,749 B2 * | 3/2003 | Rudick et al. | ................... | 62/6 |
| 6,578,367 B1 * | 6/2003 | Schaefer et al. | ............. | 62/51.1 |
| 6,598,828 B2 * | 7/2003 | Fiebick et al. | ........... | 244/118.1 |
| 6,650,535 B1 * | 11/2003 | Moss et al. | ................. | 361/687 |
| 6,906,919 B2 * | 6/2005 | Pokharna et al. | ........... | 361/687 |
| 7,003,726 B2 * | 2/2006 | Walker et al. | .............. | 715/717 |

FOREIGN PATENT DOCUMENTS

JP       5-332628 A   * 12/1993

* cited by examiner

*Primary Examiner*—Mohammad M. Ali

(57) ABSTRACT

An energy efficient cryocooler is disclosed that cools a large area with multiple cooling temperatures on multiple cooled area working in parallel for the maximum cryogenic cooling and "over-clocking" of microprocessors and computer components using liquid and/or gaseous refrigerants in phase change. A cryogenic cooling system provides simultaneous steady stream (or pulse) cryocooling of a computer components with each part of the computer system receiving cooling at it's optimum temperature. The system comprises an evaporator with liquid and gaseous refrigerant which evaporator is placed onto the microprocessor to disperse heat from said microprocessor and a enclosure around the cooled system that cools all other components in one stage. The use of the invented cryocooling system resulted in the increase 2.4 GHz "Celeron D" microprocessor frequency to 4.78 GHz. The RAM was also overclocked to 60 MHz above normal on a test system. The cryogenic cooling system is cost effective and energy effective in power and refrigerant consumption.

2 Claims, 1 Drawing Sheet

CRYOGENIC COMPUTER SYSTEM WITH PARALLEL MULTIPLE COOLING TEMPERATURES

FIELD OF THE INVENTION

The present invention relates to microprocessor and computer system cooling at cryogenic temperatures. More specifically in the area of overclocking and/or superconduction of microprocessors and computer systems using liquid and/or gaseous refrigerants in phase change.

BACKGROUND OF THE INVENTION

Microprocessors today generate large amounts of heat that needs to be dispersed. Today there are currently multiple methods of dispersing that heat. There are currently many different methods to use in cooling.

Fan cooling being the standard, which simply has a finned heatsink of aluminum or copper with the possibility of in-fused heatpipes and a fan blowing on top of it. That would keep the temperature to around 33-60° C.

Then, there is the water cooling method that uses simply a pump pushing water from a tube into a maze block which is put onto the microprocessor. Then, the water is pushed into a radiator where it is cooled with a fan and then pumped back into the reservoir from which it is pumped back again into the maze block, and so it repeats. This keeps the microprocessor at around room temperature or at least at the admitted temperature range of 33-60° C.

Also, phase change cooling (as called the current market) is known in prior art, which can go down to around −40° C. through −60° C. on current commercial products. Phase change cooling utilizes the use of a refrigerant from Freon gas to Propane, compresses it, and cools it to transform the gas into a liquid, thus bringing down the temperature of the refrigerant significantly. Then, the refrigerant is poured through a maze evaporator block in which it contacts the heat from the CPU and evaporates in thus dispersing the heat. The maximum lowest a phase change cooler has ever gotten was at −159° C. and had three stages using 3 gases with the final gas being ethylene. But it requires over 2500 W of power and was very large with an unstable design in which the temperature cannot be controlled very efficiently, if it was controlled at all. Then finally, there is liquid nitrogen cooling in which liquid nitrogen is simply poured into an open evaporator and placed onto the microprocessor.

The previous three methods mentioned are cryogenic cooling. Then of course there are the industrial cryogenic cooling methods of the use of phase change in liquid Helium, liquid Nitrogen, finally with liquid Hydrogen. Those methods are purely industrial or laboratory used because they require a 3-phase power connection and use multiple kilowatts at that, require other cooling devices to cool them, and a Stirling Cycle Cryocooler (known as a liquefier in this form of use) or a expensive variation to be used. Not only that, but some of them require a vacuum around the object cooled. Finally, because they cannot disperse enough heat over an area of 50 W while making a large usually 250 W version to be extremely expensive and even more complex.

For example, U.S. Pat. No. 5,647,217 granted to L. B. Penswick and R. E. Neely gives the general design of the Stirling Cycle Cryogenic Cooler. That consists of a compressor piston inside a cylinder and an expansion piston within a cylinder and a driving mechanism such as a motor. Then this functions as a reciprocating motion compressor which can be expanded as shown then the stated patent into a cryocooler.

A newer option is a Vortex tube but that requires a high power air compressor with a large supply of air. Thus the 3-phase power requirement is also needed. And though the compressor may be several hundred kg in weight, the cooling is simply a much colder fan blowing as around −30° C. at it's lowest. The idea behind is a good because the design can be very small, but the machinery required to run it for all it's inferior cooling power to water cooling and Peltiers (thermoelectric coolers), any other cryocooler make it not very efficient to use in most situations.

There is of course the, older Joule-Thomson cryostat which has a "Joule-Thompson Valve", but again you need a constant supply of high pressure gas and you need a large amount of the gas used. Thus, that requires a pump, a large compressor, a heat exchanger to cool the compressor, a multi-hundred gallon if not more pressurized gas tank, and still the 3-phase power requirement which is only available in industrial zone.

The top cooling is using lasers to slow down single atoms to temperatures very near absolute zero thus resulting into a Bose-Einstein Condensate (BEC). This is the coldest object in the Universe but is only the size of a few atoms and must be kept in a magnetic field and in a vacuum to make this. This is only possible in laboratories and under certain machinery and conditions not to mention the cost of millions of dollars for the equipment need. The BEC also is too small to cool an object with a mass slightly greater then itself. Thus this cannot be used in any application where extreme cooling is needed other then to be used in experiments.

But there is no use for a cryocooler to be used on microprocessors other then on super computers unless two more factors are taken into account. A microprocessor or more specifically a computer's CPU can be "over-clocked" or have it's voltage raised to force more electrical current through it's transistors thus effectively allow raising the processor frequency and so increasing the operational speed. But the extra current and voltage through such a small space would create more heat which would need to be dispersed or otherwise it will melt the transistors which range from 30-130 nanometers in thickness. The higher the current the more heat and thus the more cooling needed.

The second factor is superconduction which is only available under 2 Kelvin and that is with only liquid Helium and liquid Hydrogen The benefit of superconduction is that the resistance in the transistors is significantly lowered thus allowing the electrical current to achieve it's maximum transfer speed through the microprocessor. The performance boost is to be an added 10% of the previous speed. But superconduction in CPU's is purely theoretical until scientific progression in superconducting materials.

SUMMARY OF THE INVENTION

One object of this invention is to allow for the steady stream (or pulse) cryocooling of a computer system with each part of the computer system receiving cooling at it's optimum temperature.

Another object is that the system is cost effective and energy effective in power and refrigerant consumption.

A third object of the invention is to provide the cooling in an efficient and powerful (measured in amount of wattage cooled by each part of the cooler) to allow for the stable "overclocking" for each component of the computer system that can be over-clocked with those being mainly, one or more CPUs, the video graphics adapter(s), memory, the motherboard chipset(s), and the data storage(s).

This invention accomplishes the above objectives and allows for the following on multiple refrigerants with the intended one for use being Liquid Nitrogen, Liquid Argon, or Liquid Helium. A fast start-up time utilizing the boot refrigerant and fast response control over the cooling is incorporated easily into the system. A clean vacuum inside the unit for keeping the components from environmental damage and condensation with the use of the boot refrigerant which is neutral if the fuels/refrigerants stated above are used. The ability to be used with multiple refrigerants as fuels (definite Liquid Helium and Liquid Nitrogen with other refrigerants also possible). The cooling system can provide cooling at different temperatures in different modes (pulse or steady stream) and that in different areas of the cooler if needed with temperatures ranging from 0° Celsius to the maximum lowest the cooling refrigerant can go down to with that being −196 degrees Celsius (70 Kelvin) and even lower at down to a possible 2 Kelvin with the use of Liquid Helium as base boot fuel and main refrigerant. Finally with the cooler being able to supply significant heat removal (measured in Watts cooled). Then provide that same cooling in a steady non-ending flow if needed for extended periods of time if needed. This is all incorporated into this invention and yet the power consumed is generally small for this type of cooling and because the cooler is single stage then the cost of it can be lower and it can be generally be easily mass produced because of it's simplicity against other coolers in this field.

Thus, with the cooling sufficiently supplied as stated, the object for which this invention is intended can be achieved with increased speeds through over-clocking (and possibly superconduction when transistor technology reaches that point) on the computer system placed inside the cooler.

DETAILED DESCRIPTION AND PREFERRED EMBODIMENTS OF THE INVENTION

Figure 1:
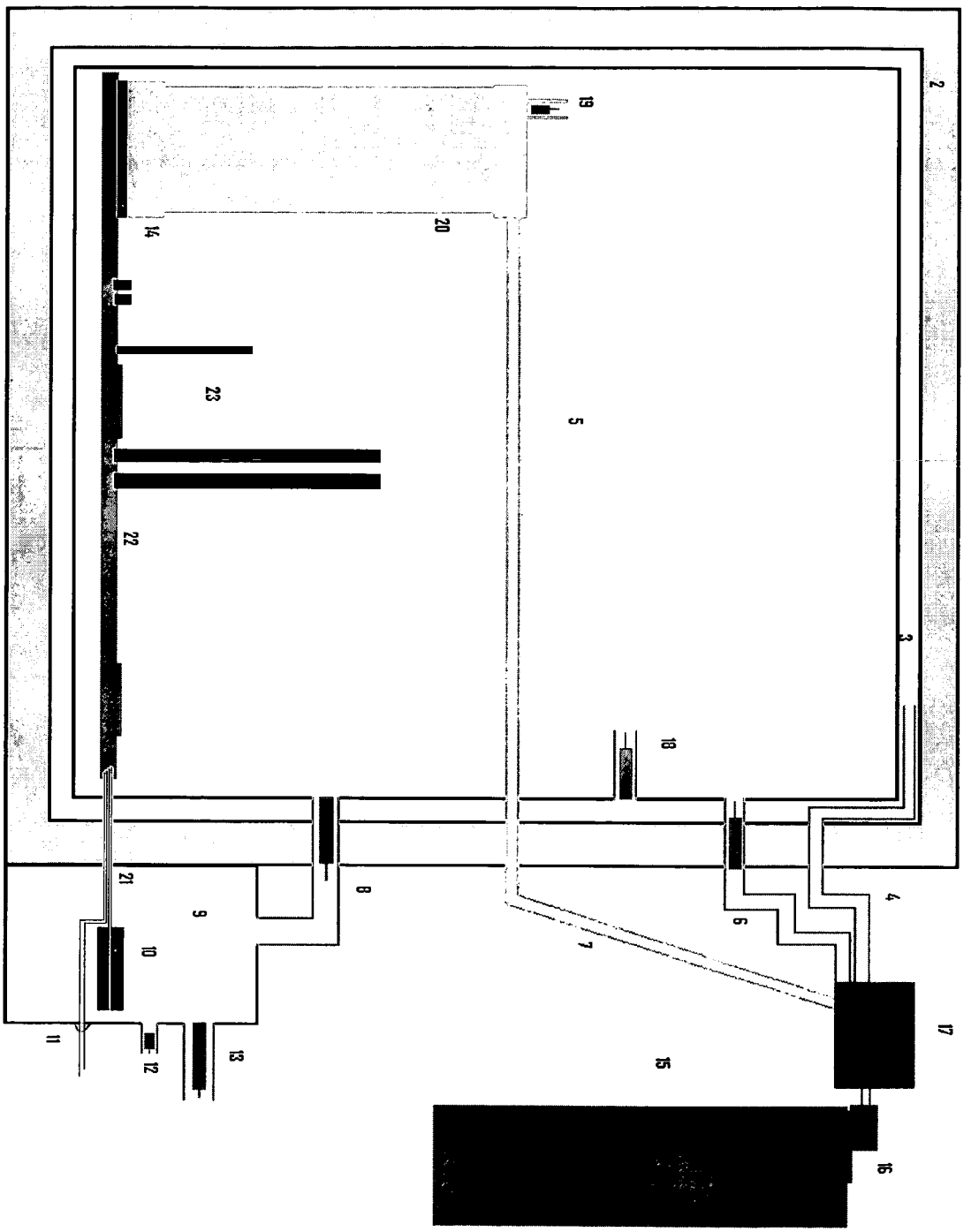
FIG. 1 is a non-closed cycle variation the general design of the cryogenic computer system according to present invention.

The basic elements of the invention are virtually the same but can vary from different variations that are based on the same idea of a single source of liquid refrigerant used to cool multiple parts of a computer system with the intent of cryocooling the CPU microprocessor(s) to "over-clock" it (using an evaporator), and at the same time to cool all the other parts on the system including the data storage (hard drive), memory chipset, video graphics card chips and memory, southbridge and/or northbridge (either where applicable on the motherboard used) using a single cooling stage for all together not including the CPU (which is cooled by an evaporator for optimum cryocooling. Then, to do the above without condensation or even in a vacuum (possible with an extra gas pump) the design must remain basically the same in general.

FIG. 1 schematically illustrates the general construction from a cut side view of the invention. The basis of a computer system is a motherboard 22. Onto this the CPU(s) 14 is placed into the CPU socket. This is the cooled surface for the evaporator. Then of course, there are the computer system vital plug-in components 23, which are at minimum the memory and video graphics card.

The main body of the cryocooler is composed of three cubes with their sides being represented in FIG. 1 by walls. First, the outer wall 1 is on the outside of the cooler. The median wall 2 is inside the outer wall 1 and the area in between is filled with a thermal insulation. The inside wall 3 is inside the median wall 2 and the area in between is hollow. This hollow area is where the motherboard 22 and plug in component 23 cooling takes place. This area would be filled with the liquid andlor gas refrigerant after the oxygen is purged out at start-up. This would make the main chamber 5, the temperature of the refrigerant (or cooling gas if cold gas is used to cool for components that might not be able to function under below −40° C.). The inner wall evaporation outlet 19 is the outlet for the gas form of the refrigerant that evaporated (or was heated, if cold gas was used to cool the main chamber 5) during the cooling of the main chamber 5 so that, it enters the chamber and flows through to the only outlet 8 from the main chamber 5 thus constantly keeping the gas around the computer system components at least neutral to prevent condensation and damaging or short circuiting the system (this is not necessary if a vacuum pump is used as explained later). The opening to the inside of the main chamber 5 is a multilayered vault style door with multiple layers of insulation and a rubber covering around the edges to keep the main chamber 5 airtight. This door is not represented on FIG. 1 but on the actual cryocooler, the door would be put in instead of one side.

There is an evaporator 20 placed onto the cooled surface or CPU microprocessor 14 and consists of a closed chamber with one inlet and one outlet 19. The outlet 19 lets the evaporated refrigerant exit the evaporator 20 through a one way valve opening from the inside of the evaporator 20 into the main chamber 5.

For the cooler, the control wires 21 and the data storage (hard drive) 10, must be let out through an insulated hole as the plastic cords to the keyboard and the spinning disks inside the data storage do not allow cryogenic temperatures because of material damage. Note that if memory hard drives are used in which memory (RAM) is used to hold data as storage, then the storage can be placed onto the motherboard, but in this instance though the average wired data storage is referred to.

The data storage 10 is placed inside a enclosure 9 with one inlet point and two outlet points (large and small) with those being the expansion port outlet 13 and oxygen purge/evaporated refrigerant outlet 12 respectively. The expansion port outlet 13 is for the possibility of establishing a vacuum for the use of liquid helium (to insulate the whole unit, thus providing better cooling) and allows for the pump unit required for establishing a vacuum to be attached with one way pressure valve opening from the inside of the enclosure. The oxygen purge/evaporated refrigerant outlet 12 is for letting out the oxygen first pushed out during the purging of the main chamber with nitrogen and then for letting out the evaporated nitrogen after that. If a vacuum pump is attached to the expansion outlet port 13, then this valve would be locked.

The refrigerant Dewar vessel 15 is connected to a automated open/close valve 16 that controls the flow of the liquid refrigerant. That is connected to a controller 17 which is automated to distribute the liquid refrigerant to the evaporator 20 through a line pipe 7, to the hollow area between the median wall 2 and inner wall 1 through a thin tube 4, and finally distributes the gas form of the refrigerant through a tube 6 which goes straight through the main chamber 5. The distribution of the gases is controlled through a simple computer chip controlling current flow to motorized clamps put on each of the pipes with those being tube 6, tube 4, and pipe 7.

The foregoing examples of the invention are illustrative and explanatory. The examples are not intended to be exhaustive and serve only to show the possibilities of the invented technology.

EXAMPLE

The cryogenic computer system according to present invention was tested on two systems. A market low-end system tested contained the following main components: a Celeron D "320" microprocessor with a frequency of 2.4 GHz, an Abit VT7 motherboard, 2 GB of 400 MHz clocked memory (RAM), a GeForce Fx5200 128 MB video card, and a 120 GB 7200 rpm SATA hard drive (data storage). The following results were obtained after the invention is used on the said system. The 2.4 GHz processor frequency was raised to 4.780 GHz. This is an almost 100% increase to the original speed. The RAM was also overclocked to 60 MHz above normal. The video graphics card was also overclocked to an extra 128 MHz. When tested for benchmarks, the original non-overclocked or cryo-cooled system retained an average 8 fps (frames per second) in a benchmark test on an advanced graphical game called Doom 3. The overclocked system achieved 15 fps. In a professional program called 3D mark 2005, the original overall result of 254 was raised to 346. But the small increase was limited to the tested video card as the FX series of video cards from nVidia does not meet the requirements for a high benchmark in the heavily special effect and pixel/vertex shader reliant 3D Mark 2005. A more advanced computer system setup with a GeForce 7800GTX video card and Pentium 4 "660" 3.60 GHz processor incorporated into the same cooling system yielded stable processor clock frequencies up to 6.040 GHz. The 3D Mark 2005 stock score of 7.815 was raised to 11,560.

What is claimed is:

1. A cryogenic computer system with multiple parallel cooling temperatures simultaneously provided to all system parts that comprises of:
    a cooled surface on the microprocessor,
    an evaporator with liquid and gaseous refrigerant which is placed onto the microprocessor to disperse heat from the said microprocessor with the said evaporator having a minimum of one inlet and one outlet for the refrigerant,
    an insulated large enclosure into which the computer system and evaporator is placed inside of and the said enclosure having multiple walls (layers) with the area between the two innermost walls to be hollow and the other layers to be filled with insulation while the data storage and controls (keyboard, mouse) are wired to the outside,
    a small enclosure attached to the large enclosure to house the computer system storage,
    a pair of one way pressure valves with one for dry neutral gas to push out the air during the start-up flushing of the enclosure to establish a clean dry environment and leave only a neutral gas inside the enclosure, and a second valve for the possibility of putting in a pump for making a vacuum or a compressor for a closed cycle system,
    a pipe from the inside of the enclosure opening up into the small storage enclosure with the said pipe housing a one way valve facing the inside of the enclosure,
    a pipe to run through the wall layers in said enclosure and to connect to the inlet of the evaporator while the second end connects to a thermal control valve or a computer controlled thermal controller with either being connected to a liquid refrigerant source,
    a valve on the innermost wall that only opens from the inside of the hollow area in the said enclosure,
    a pipe to open into the enclosure from the outside,
    a pipe to open into the hollow area from the outside,
    a controller,
    an insulated Dewar vessel housing the boot/startup refrigerant, and
    a motorized valve connecting the Dewar vessel to the controller valves to distribute the refrigerant.

2. A controller for a cryogenic computer system with multiple parallel cooling temperatures simultaneously provided to all parts from one source comprising of:
    a system of multiple motorized valves to distribute the right amount of liquid and gaseous refrigerant sent at the right time to the microprocessor and computer components to be cooled by direct piping in the interior chamber,
    a system of connections from said piping to at least two of the aforementioned motorized valves, and
    a motorized valve connected directly to the inlet pipe from the evaporator.

* * * * *